US008169259B2

(12) United States Patent
Choi

(10) Patent No.: US 8,169,259 B2
(45) Date of Patent: May 1, 2012

(54) ACTIVE FILTER, DELTA-SIGMA MODULATOR, AND SYSTEM

(75) Inventor: Moo-Yeol Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 12/610,605

(22) Filed: Nov. 2, 2009

(65) Prior Publication Data

US 2010/0117723 A1    May 13, 2010

(30) Foreign Application Priority Data

Nov. 10, 2008   (KR) .................. 10-2008-0110998

(51) Int. Cl.
*H03K 5/00*    (2006.01)
(52) U.S. Cl. ........................................ 327/552; 327/344
(58) Field of Classification Search ................ None
See application file for complete search history.

(56) References Cited

U.S. PATENT DOCUMENTS

| | | | |
|---|---|---|---|
| 4,999,634 A | | 3/1991 | Brazdrum et al. |
| 5,072,200 A | * | 12/1991 | Ranky ............................ 333/167 |
| 5,559,474 A | * | 9/1996 | Matsumoto et al. ............ 331/17 |
| 5,914,633 A | * | 6/1999 | Comino et al. ................ 327/553 |
| 6,320,459 B2 | * | 11/2001 | McCullough .................. 327/558 |
| 7,016,450 B2 | * | 3/2006 | Lin et al. ........................ 375/374 |
| 7,081,788 B2 | * | 7/2006 | Hagari ............................ 327/553 |
| 2007/0008200 A1 | | 1/2007 | Hsieh et al. |
| 2010/0260295 A1 | * | 10/2010 | Okada et al. ................... 375/350 |

FOREIGN PATENT DOCUMENTS

KR    1020010075390 A    8/2001

OTHER PUBLICATIONS

Lee, Bum-Ha et al., "(Design of a Fourth-Order Sigma-Delta Modulator Using Direct Feedback Method)", Dept. of Elec. Eng., Kyungpook University, Jun. 1998, pp. 39-47.

* cited by examiner

*Primary Examiner* — Lincoln Donovan
*Assistant Examiner* — Terry L Englund
(74) *Attorney, Agent, or Firm* — Volentine & Whitt, PLLC

(57) ABSTRACT

An active filter includes a first filter and a second filter. The first filter receives an input signal, and generates a first output signal by filtering the input signal. The second filter receives the first output signal during a time period adjusted based on a variation of a time constant of the first filter, and generates a second output signal by filtering the first output signal received during the time period. Therefore, a variation of a time constant is compensated by using post integration time control.

7 Claims, 11 Drawing Sheets

ACTIVE FILTER, DELTA-SIGMA MODULATOR, AND SYSTEM

CROSS-REFERENCE TO RELATED APPLICATION

This application claims priority under 35 USC §119 to Korean Patent Application No. 10-2008-0110998 filed on Nov. 10, 2008, the subject matter of which is hereby incorporated by reference.

BACKGROUND

The inventive concept relates to integrated circuits, and more particularly to an active filter using post integration time control and a delta-sigma modulator including the active filter.

An active filter passes or rejects signals having frequencies within a predetermined range or band. In general, an active filter includes not only passive components, such as a resistor, a capacitor, etc., but also one or more active components, such as an operational amplifier. The so-called response characteristic of an active filter may be more easily modified than the response characteristic of an analogous passive filter (i.e., a filter including only passive components). The active filter, as well as circuit elements coupled to the active filter, (e.g., a power supply, a load, etc.), are not affected by each other when the active filter employs an operational amplifier having high input impedance and low output impedance.

A delta-sigma modulator may be employed within an active filter as a loop filter. The delta-sigma modulator is widely used to minimize quantization noise that may be caused when an analog signal is converted into a digital signal. As conventionally implemented, delta-sigma modulators may be classified as a discrete-time delta-sigma modulator and a continuous-time delta-sigma modulator according to the type of loop filter being implemented.

The discrete-time delta-sigma modulator has the advantages of low filter coefficient variation and high frequency scalability. However, the discrete-time delta-sigma modulator has high power consumption, and a switching noise may be generated at its input stage. The discrete-time delta-sigma modulator further requires the inclusion of an anti-aliasing filter to minimize aliasing that occurs when a high-resolution signal is converted into a low-resolution signal.

In contrast, the continuous-time delta-sigma modulator may not require an anti-aliasing filter and consumes less power, as compared with the discrete-time delta-sigma modulator. However, filter characteristics of the continuous-time delta-sigma modulator may be changed depending on a passive component variation due to a manufacturing process variation, an operating temperature variation, or the like.

SUMMARY

Embodiments of the inventive concept provide an active filter compensating for passive component variation by using a post integration time control technique. Embodiments of the inventive concept also provide reduced switching noise at an input stage of the active filter.

Certain embodiments of the inventive concept provide a delta-sigma modulator capable of compensating for passive component variation by using a post integration time control technique, maintaining anti-aliasing filtering (AAF) characteristics, and reducing noise caused by a modulation between an input signal and an integration time control signal.

According to some example embodiments, an active filter includes a first filter and a second filter.

The first filter receives an input signal, and generates a first output signal by filtering the input signal. The second filter receives the first output signal during a time period that is adjusted based on a variation of a time constant of the first filter, and generates a second output signal by filtering the first output signal received during the time period.

In certain embodiments, the time period may be adjusted to compensate for variations of the time constant of the first filter. The time period may increase as the time constant of the first filter increases, and decrease as the time constant of the first filter decreases.

In certain embodiments, the second filter may include a switch that is turned ON during the time period, and the second filter may receive the first output signal while the switch is turned ON.

In certain embodiments, the first filter may include a first resistor having a first terminal for receiving the input signal and a second terminal coupled to a first node, a first capacitor having a first terminal coupled to the first node and a second terminal coupled to a second node, and a first operational amplifier having an input terminal coupled to the first node and an output terminal coupled to the second node.

In certain embodiments, the second filter may include a second resistor having a first terminal coupled to the second node and a second terminal coupled to a third node, a switch having a first terminal coupled to the third node and a second terminal coupled to a fourth node, and being turned on during the time period, at least one second capacitor having a first terminal coupled to the fourth node and a second terminal coupled to a fifth node, and a second operational amplifier having an input terminal coupled to the fourth node and an output terminal coupled to the fifth node.

In other embodiments, the second filter may include a switch having a first terminal coupled to the second node and a second terminal coupled to a third node, and being turned on during the time period, a second resistor having a first terminal coupled to the third node and a second terminal coupled to a fourth node, at least one second capacitor having a first terminal coupled to the fourth node and a second terminal coupled to a fifth node, and a second operational amplifier having an input terminal coupled to the fourth node and an output terminal coupled to the fifth node.

According to some embodiments of the inventive concept, a delta-sigma modulator includes a first filter, a second filter, a quantizer and a digital-analog converting unit.

The first filter receives an input signal and a feedback signal, and generates a first integration signal based on the input signal and the feedback signal. The second filter receives the feedback signal, receives the first integration signal during a time period that is adjusted based on a variation of a time constant of the first filter, and generates a second integration signal based on the feedback signal and the first integration signal received during the time period. The quantizer generates a digital output signal based on the second integration signal. The digital-analog converting unit generates the feedback signal by converting the digital output signal.

In certain embodiments, the digital-analog converting unit may include a first digital-analog converter configured to generate the feedback signal by converting the digital output signal, and configured to provide the feedback signal to the first filter, and a second digital-analog converter configured to generate the feedback signal by converting the digital output signal, and configured to provide the feedback signal to the second filter.

In certain embodiments, the delta-sigma modulator may further include a control signal generating unit configured to generate a control clock signal of which a duty ratio is adjusted depending on the variation of the time constant of the first filter.

In certain embodiments, the control signal generating unit may adjust the duty ratio of the control clock signal to compensate the variation of the time constant of the first filter. The control signal generating unit may increase the duty ratio of the control clock signal as the time constant of the first filter increases, and decrease the duty ratio of the control clock signal as the time constant of the first filter decreases.

In certain embodiments, the second filter may adjust the time period for receiving the first integration signal in response to the control clock signal.

In certain embodiments, the control signal generating unit may include a reference generating unit configured to generate a first reference voltage and a second reference voltage, a current generating unit configured to generate a current corresponding to the variation of the time constant of the first filter based on the first reference voltage, a voltage generating unit configured to generate a voltage corresponding to the variation of the time constant of the first filter based on the current generated by the current generating unit, and a comparing unit configured to generate the control clock signal by comparing the voltage generated by the voltage generating unit with the second reference voltage.

In certain embodiments, the reference generating unit may include a voltage divider coupled between a first power supply voltage and a second power supply voltage.

In certain embodiments, the current generating unit may include a resistor of which a resistance is varied in proportion to an impedance variation of a passive component included in the first filter such that the current generating unit may generate the current based on the resistance of the resistor.

In certain embodiments, the current generating unit may include an operational amplifier having a first input terminal for receiving the first reference voltage, a second input terminal coupled to a node, and an output terminal, an n-channel metal-oxide-semiconductor (NMOS) transistor having a gate terminal coupled to the output terminal of the operational amplifier, a source terminal coupled to the node, and a drain terminal coupled to the voltage generating unit, and a resistor having a first terminal coupled to the node and a second terminal coupled to a power supply voltage.

In certain embodiments, the voltage generating unit may include a capacitor of which a capacitance is varied in proportion to an impedance variation of a passive component included in the first filter such that the voltage generating unit may generate the voltage based on the capacitance of the capacitor.

In certain embodiments, the voltage generating unit may include a feedback switch configured to adjust a time for receiving the current generated by the current generating unit in response to the control clock signal, a capacitor being charged based on the current received through the feedback switch, and a reset switch coupled in parallel with the capacitor, and configured to periodically discharge the capacitor.

In certain embodiments, the delta-sigma modulator may further include at least one third filter configured to receive the feedback signal and the second integration signal, and configured to generate a third integration signal based on the feedback signal and the second integration signal.

According to certain embodiments, a passive component variation or a time constant variation may be compensated by using a post integration time control technique, thereby reducing a switching noise and improving a signal-to-quantization noise ratio (SQNR). Further, according to some example embodiments, an active filter and a delta-sigma modulator may not require an anti-aliasing filter and have a small size.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Embodiments of the inventive concept will now be described with reference to the accompanying drawings. The inventive concept may, however, be embodied in many different forms and should not be construed as being limited to only the illustrated embodiments. Rather, these example embodiments are provided so that this disclosure will be thorough and complete, and will fully convey the scope of the present inventive concept to those skilled in the art.

Throughout the drawings and written description, like numerals and labels are used to denote like or similar elements. It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
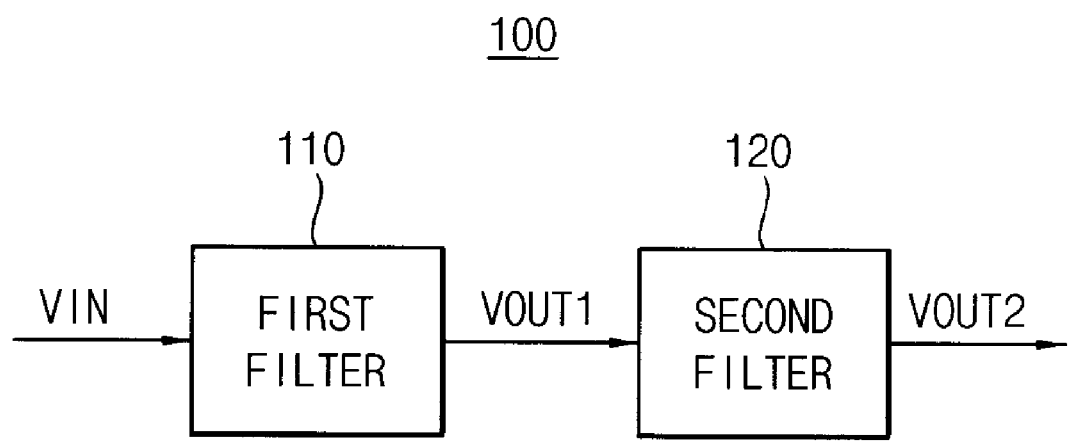
FIG. 1 is a block diagram illustrating an active filter according to some example embodiments.

FIG. 1 is a block diagram illustrating an active filter according to an embodiment of the inventive concept. Referring to FIG. 1, an active filter 100 comprises a first filter 110 and a second filter 120.

The first filter 110 receives an input signal VIN, and generates a first output signal VOUT1 by filtering the input signal VIN. The first filter 110 may include one or more passive components such as a resistor, a capacitor, etc., and one or more active components such as an operational amplifier. The first filter 110 may filter the input signal VIN by passing or rejecting signals of frequencies within a predetermined range. For example, the first filter 110 may include a low-pass filter, a high-pass filter, a band-pass filter, or a band-rejection filter.

The second filter 120 receives the first output signal VOUT1, and generates a second output signal VOUT2 by filtering the first output signal VOUT1. The second filter 120 may include one or more passive components and one or more active components. The second filter 120 may filter the first output signal VOUT1 by passing or rejecting signals of frequencies within a predetermined band.

In addition, the second filter 120 adjusts a time period for receiving the first output signal VOUT1 to compensate a variation of a time constant of the first filter 110. The passive components of the first filter 110, such as a resistor, a capacitor, etc., may be affected by a manufacturing process variation, an operating temperature variation, or the like, and thus the time constant and filter coefficients of the first filter 110 may be varied. The time period during which the second filter 120 receives the first output signal VOUT1 may be adaptively adjusted to prevent a filter characteristic deterioration caused by the time constant variation of the first filter 110. For example, when the time constant of the first filter 110 increases compared with a desired time constant, the second filter 120 increases the time period for receiving the first output signal VOUT1 to compensate the time constant variation. When the time constant of the first filter 110 decreases compared with the desired time constant, the second filter 120 decreases the time period for receiving the first output signal VOUT1 to compensate the time constant variation. Accordingly, variation of the time constant for the first filter 110 is compensated at an output stage of the first filter 110, thereby reducing switching noise.

Figure 2:
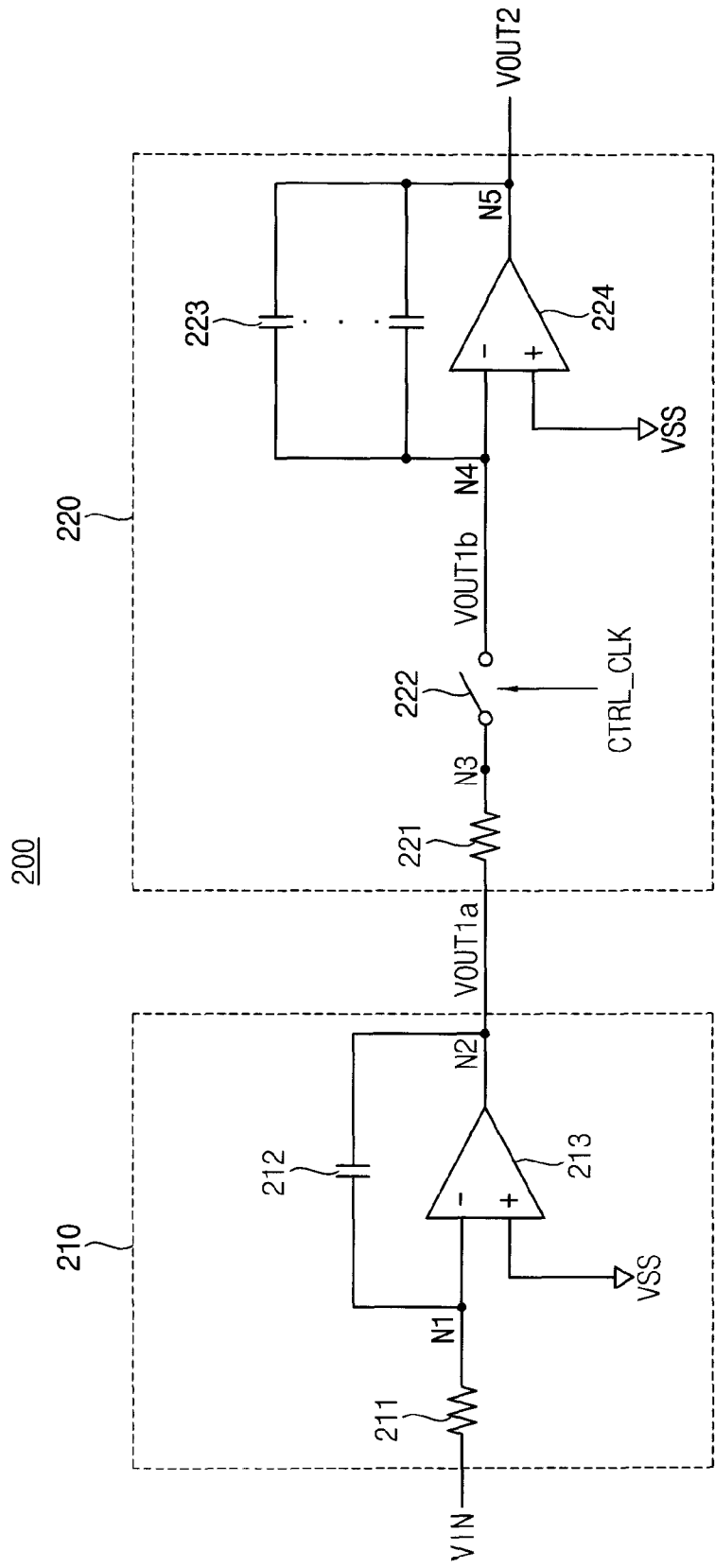
FIG. 2 is a circuit diagram illustrating an example of the active filter of FIG. 1.

FIG. 2 is a circuit diagram further illustrating in one example the active filter of FIG. 1. Referring to FIG. 2, an active filter 200 comprises a first filter 210 and a second filter 220. The first filter 210 may include a first resistor 211, a first capacitor 212 and a first operational amplifier 213. The second filter 220 may include a second resistor 221, a switch 222, one or more second capacitors 223 and a second operational amplifier 224.

The first resistor 211 may include a first terminal for receiving an input signal VIN, and a second terminal coupled to a first node N1. The first capacitor 212 may include a first terminal coupled to the first node N1 and a second terminal coupled to a second node N2. The first operational amplifier 213 may include a first input terminal coupled to the first node N1, a second input terminal coupled to a power supply voltage VSS (e.g., a ground voltage), and an output terminal coupled to the second node N2.

Figure 7:
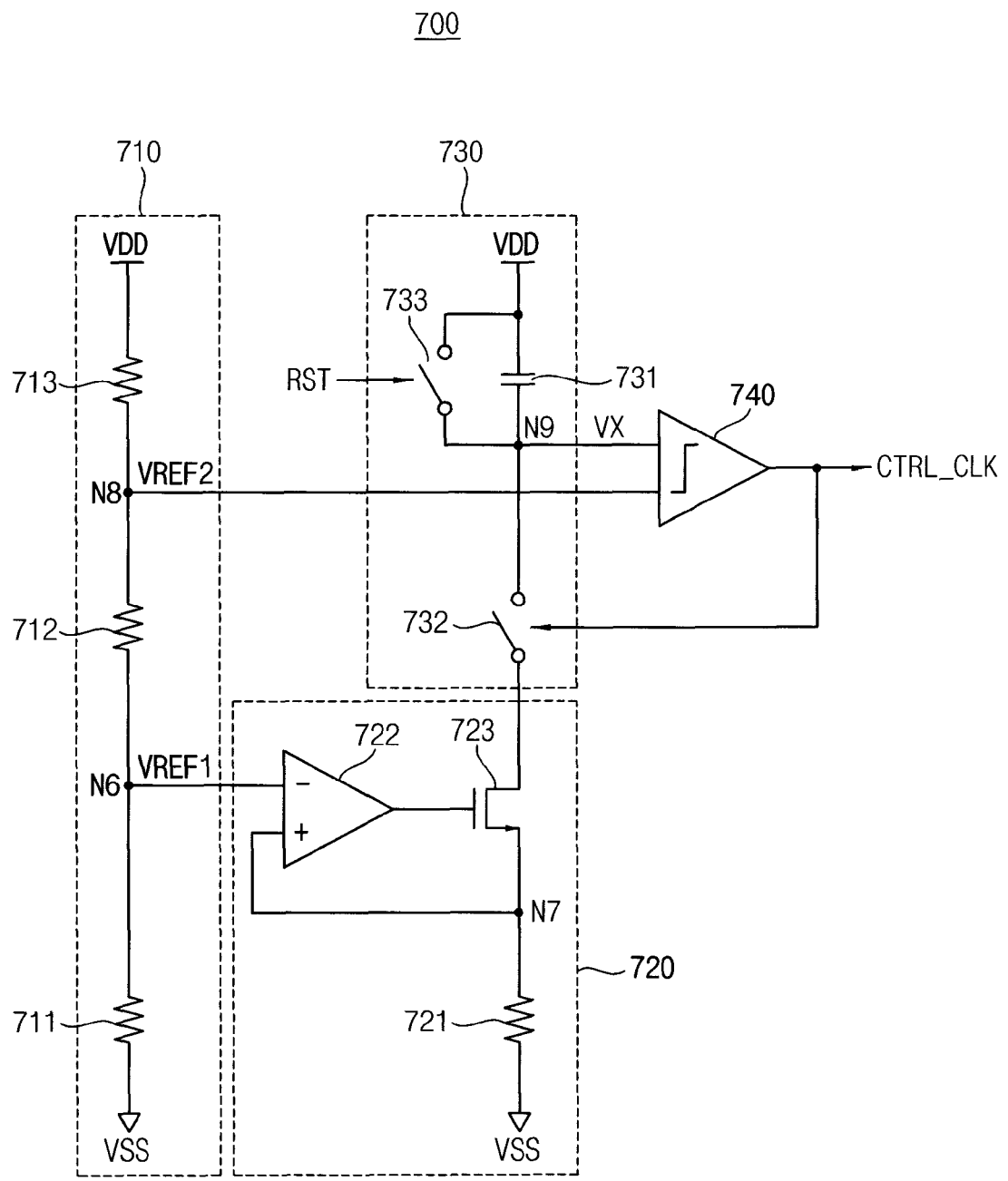
FIG. 7 is a circuit diagram illustrating a control signal generating unit included in the delta-sigma modulator of FIG. 6.

The second resistor 221 may include a first terminal coupled to the second node N2 (i.e., an output terminal of the first filter 210) and a second terminal coupled to a third node N3. The switch 222 may include a first terminal coupled to the third node N3 and a second terminal coupled to a fourth node N4. The switch 222 may be turned ON during a time period adjusted based on a time constant variation of the first filter 210. The switch 222 may be turned ON in response to a control clock signal CTRL_CLK. In certain embodiments, the control clock signal CTRL_CLK may be provided from an external circuit. In other embodiments, the active filter 200 may further include a control signal generating unit 700 as illustrated in FIG. 7 for generating the control clock signal CTRL_CLK.

The second capacitors 223 may be coupled to each other in parallel. The second capacitors 223 may include first terminals coupled to the fourth node N4 and second terminals coupled to a fifth node N5. While the second filter 220 is illustrated in FIG. 2 as including a plurality of second capacitors 223, the second filter 220 may include one capacitor. The second operational amplifier 224 may include a first input terminal coupled to the fourth node N4, a second input terminal coupled the power supply voltage VSS, and an output terminal coupled to the fifth node N5.

In certain embodiments, the first filter 210, as illustrated in FIG. 2, may be an integrator operating as a low-pass filter including the first resistor 211 coupled to the first input terminal of the first operational amplifier 213 and the first capacitor 212 coupled between the first input terminal and the output terminal of the first operational amplifier 213. The second filter 220, as illustrated in FIG. 2, may be an integrator operating as a low-pass filter. The first filter 210 may generate a first output signal VOUT1$a$ by integrating the input signal VIN, and the second filter 220 may generate a second output signal VOUT2 by integrating the first output signal VOUT1$a$.

The respective impedances of passive components (i.e., the first resistor 211 and the first capacitor 212) of the first filter 210 may vary from specification due to a manufacturing process variation(s), changes in operating temperature, or the like. Accordingly, a time constant and filter coefficients for the first filter 210 may be different than a desired time constant and filter coefficients. For example, if a resistance of the first resistor 211 or a capacitance of the first capacitor 212 increases, the time constant of the first filter 210 decreases, and thus the first output signal VOUT1$a$ too rapidly changes. If the resistance of the first resistor 211 or the capacitance of the first capacitor 212 decreases, the time constant of the first filter 210 increases, and thus the first output signal VOUT1$a$ too slowly changes. Accordingly, the first output signal VOUT1a may be distorted and may have a value different from a desired value.

The second filter 220 adjusts the time period for receiving the first output signal VOUT1a by using the switch 222 to compensate the time constant variation of the first filter 210. For example, when the time constant of the first filter 210 decreases, the second filter 220 may decrease a turn-ON time of the switch 222. When the time constant of the first filter 210 increases, the second filter 220 may increase the turn-ON time of the switch 222. Since the turn-ON time of the switch 222 is adjusted to compensate the time constant variation of the first filter 210, a signal VOUT1b at the second terminal of the switch 222 may have a desired value despite the time constant variation of the first filter 210.

As described above, the time constant variation of the first filter 210 may be compensated at the output stage of the first filter 210. Accordingly, noise caused by modulation between an input signal and a switch control signal does not occur, and an anti-aliasing filtering (AAF) characteristic of the first filter 210 may be maintained.

Similar to a manner for compensating the time constant variation of the first filter 210, impedance variations for passive components included in the second filter 220 may be compensated by a subsequent filter (not shown) coupled to an output terminal of the second filter 220. Alternatively, a time constant variation of the second filter 220 may be compensated by adjusting the capacitance of the second capacitors 223 coupled in parallel as illustrated in FIG. 2. In certain embodiments, the capacitance of the second capacitors 223 may be adjusted by using fuses to connect/disconnect at least one of the second capacitors 223. In other embodiments, the capacitance of the second capacitors 223 may be adjusted by using at least one switch coupled between at least one of the second capacitors 223 and the fourth node N4 or between at least one of the second capacitors 223 and the fifth node N5.

Figure 3:
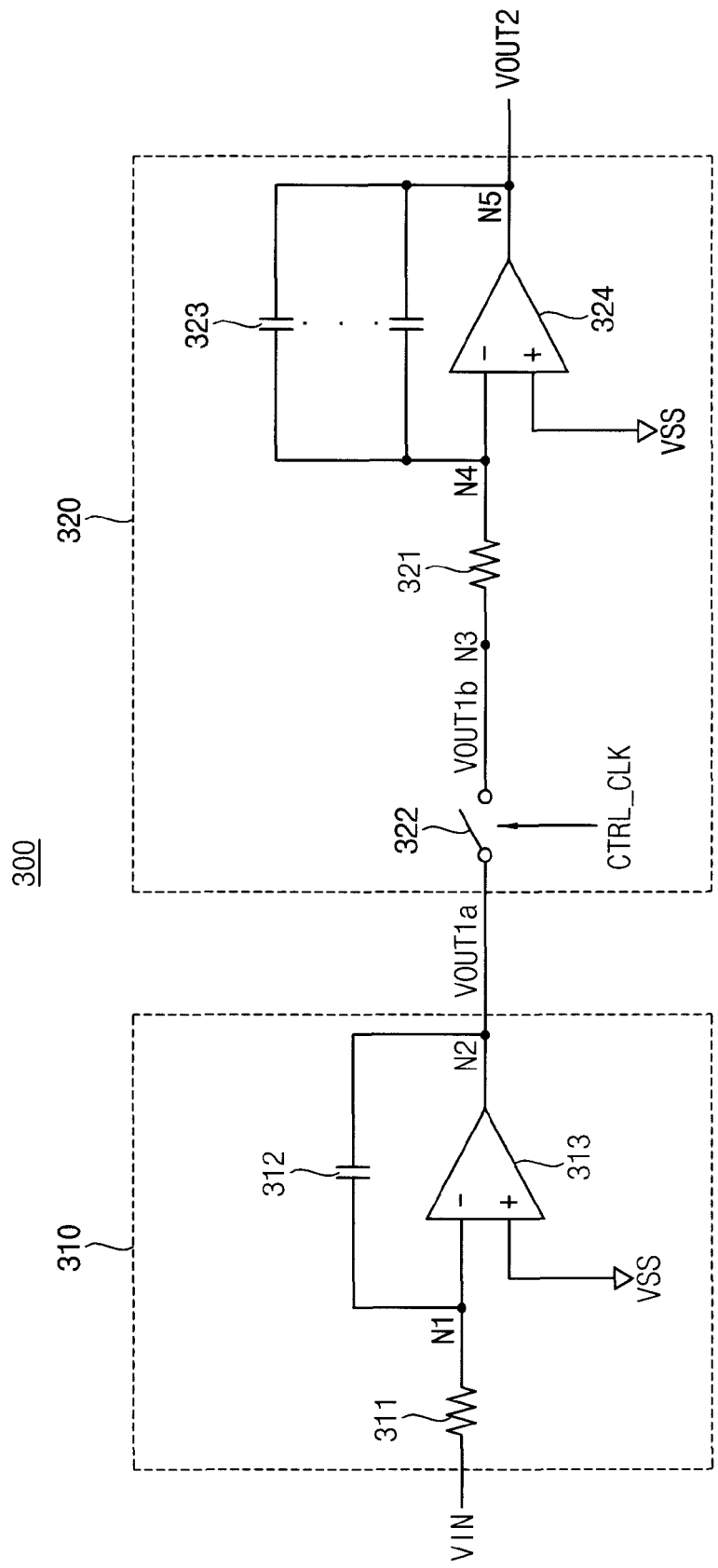
FIG. 3 is a circuit diagram illustrating another example of the active filter of FIG. 1.

FIG. 3 is a circuit diagram further illustrating another example of the active filter of FIG. 1. Referring to FIG. 3, the active filter 300 comprises a first filter 310 and a second filter 320. The first filter 310 includes a first resistor 311, a first capacitor 312 and a first operational amplifier 313. The second filter includes a second resistor 321, a switch 322, second capacitors 323 and a second operation amplifier 324. The first filter 310 illustrated in FIG. 3 has a configuration similar to the first filter 210 illustrated in FIG. 2.

The switch 322 may include a first terminal coupled to a second node N2 (i.e., an output terminal of the first filter 310) and a second terminal coupled to a third node N3. The switch 322 may be turned ON during a time period adjusted based on a time constant variation of the first filter 310. The switch 322 may be turned ON in response to a control clock signal CTRL_CLK. The second resistor 321 may include a first terminal coupled to the third node N3 and a second terminal coupled to a fourth node N4. The second capacitors 323 may include first terminals coupled to the fourth node N4 and second terminals coupled to a fifth node N5. The second operational amplifier 324 may include a first input terminal coupled to the fourth node N4, a second input terminal coupled to a power supply voltage VSS (e.g., a ground voltage), and an output terminal coupled to the fifth node N5.

The second filter 320 illustrated in FIG. 3, similarly to the second filter 220 illustrated in FIG. 2, adjusts the time period for receiving a first output signal VOUT1a by using the switch 322 to compensate a variation of a time constant of the first filter 310. Thus, a signal VOUT1b at the second terminal of the switch 322 may have a desired value despite the time constant variation. In the illustrated active filter 300 according to one embodiment of the inventive concept, since the time constant variation of the first filter 310 is compensated for by the output stage of the first filter 310, noise caused by modulation between an input signal and a switch control signal does not occur, and an AAF characteristic of the first filter 310 may be maintained.

Figure 4:
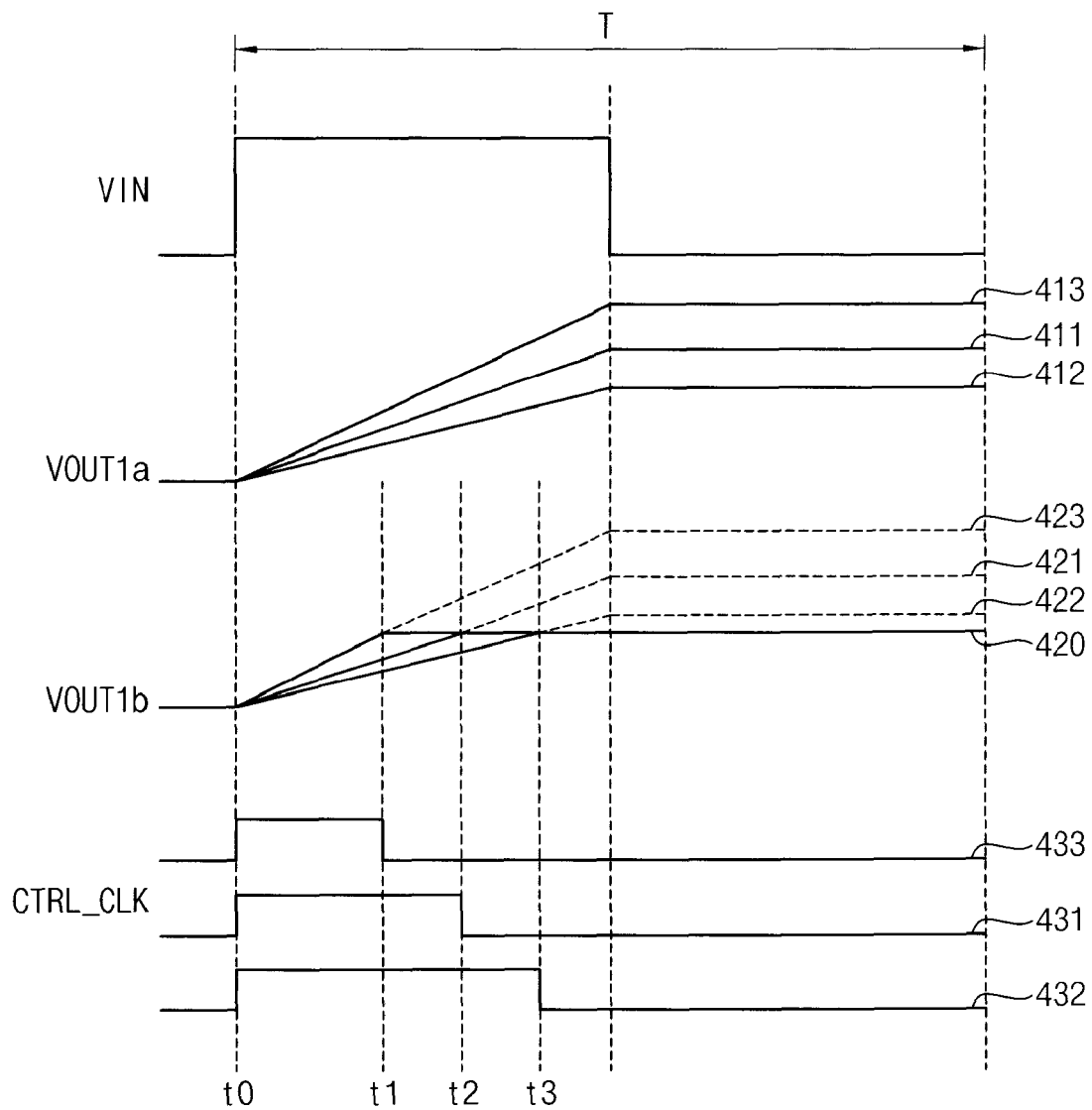
FIG. 4 is a timing diagram illustrating signals in the active filter of FIG. 2 or the active filter of FIG. 3.

FIG. 4 is a timing diagram illustrating signals in the active filter of FIG. 2 or the active filter of FIG. 3. In FIG. 4, VIN represents an input signal of the active filter of FIG. 2 or the active filter of FIG. 3, VOUT1a represents a voltage at the first terminal of the switch 222 illustrated in FIG. 2 or the switch 322 illustrated in FIG. 3, VOUT1b represents a voltage at the second terminal of the switch 222 illustrated in FIG. 2 or the switch 322 illustrated in FIG. 3, and CTRL_CLK represents a control signal applied to the switch 222 illustrated in FIG. 2 or the switch 322 illustrated in FIG. 3.

The input signal VIN may be a pulse signal as illustrated in FIG. 4. Referring collectively to FIGS. 2, 3 and 4, the first filter 210 or 310 may integrate the input signal VIN to generate an output signal VOUT1a. If a time constant of the first filter 210 or 310 decreases due to impedance increases in one or more of the passive components 211, 212, 311 and 312, the output signal VOUT1a too rapidly increases. Thus, after a first period T1 elapses, the output signal VOUT1a when the time constant is increased may have a voltage level 413 higher than a desired voltage level 411 of the output signal VOUT1a. If the time constant of the first filter 210 or 310 increases due to impedance decreases in one or more of the passive components 211, 212, 311 and 312, the output signal VOUT1a too slowly increases. Thus, after the first period T1 elapses, the output signal VOUT1a when the time constant is decreased may have a voltage level 412 lower than the desired voltage level 411.

The second filter 220 or 320 adjusts a time period for receiving the output signal VOUT1a by using the switch 222 or 322 to compensate a variation of the time constant of the first filter 210 or 310. For example, if the time constant of the first filter 210 or 310 decreases, the switch 222 or 322 receives a first control clock signal 433 having a duty cycle ratio lower than a duty cycle ratio of a second control clock signal 431 that is applied when the time constant is a desired value. That is, the first control clock signal 433 having a high level period (i.e., t0 to t1) shorter than a high level period (i.e., t0 to t2) of the second control clock signal 431 is applied to the switch 222 or 322. Thus, even though the switch 222 or 322 receives a voltage 423 rapidly increasing compared with a voltage 421 that is applied when the time constant is a desired value, the switch 222 or 322 may output a voltage 420 having a desired level by decreasing a turn-ON time of the switch 222 or 322. If the time constant of the first filter 210 or 310 increases, the switch 222 or 322 receives a third control clock signal 432 having a duty cycle ratio higher than the duty cycle ratio of the second control clock signal 431. That is, the third control clock signal 432 having a high level period (i.e., t0 to t3) longer than the high level period (i.e., t0 to t2) of the second control clock signal 431 that is applied to the switch 222 or 322. Thus, even though the switch 222 or 322 receives a voltage 422 slowly increasing compared with the voltage 421, the switch 222 or 322 may output the voltage 420 having the desired level by increasing the turn-ON time of the switch 222 or 322.

As described above, even though the impedance of one or more of the passive components included in the first filter 210 or 310 varies from specification, components of the second filter 220 or 320 may receive a voltage having a desired level. Accordingly, filter characteristics of the first filter 210 or 310 may be maintained even though the time constant of the first filter 210 or 310 has changed due to manufacturing process variation(s), operating temperature variations, and/or other related factors. Further, since the time constant variation of the first filter 210 or 310 is compensated at the output stage of the first filter 210 or 310, a noise caused by a modulation between an input signal and a switch control signal may not occur, and an AAF characteristic of the first filter 210 or 310 may be maintained.

Figure 5:
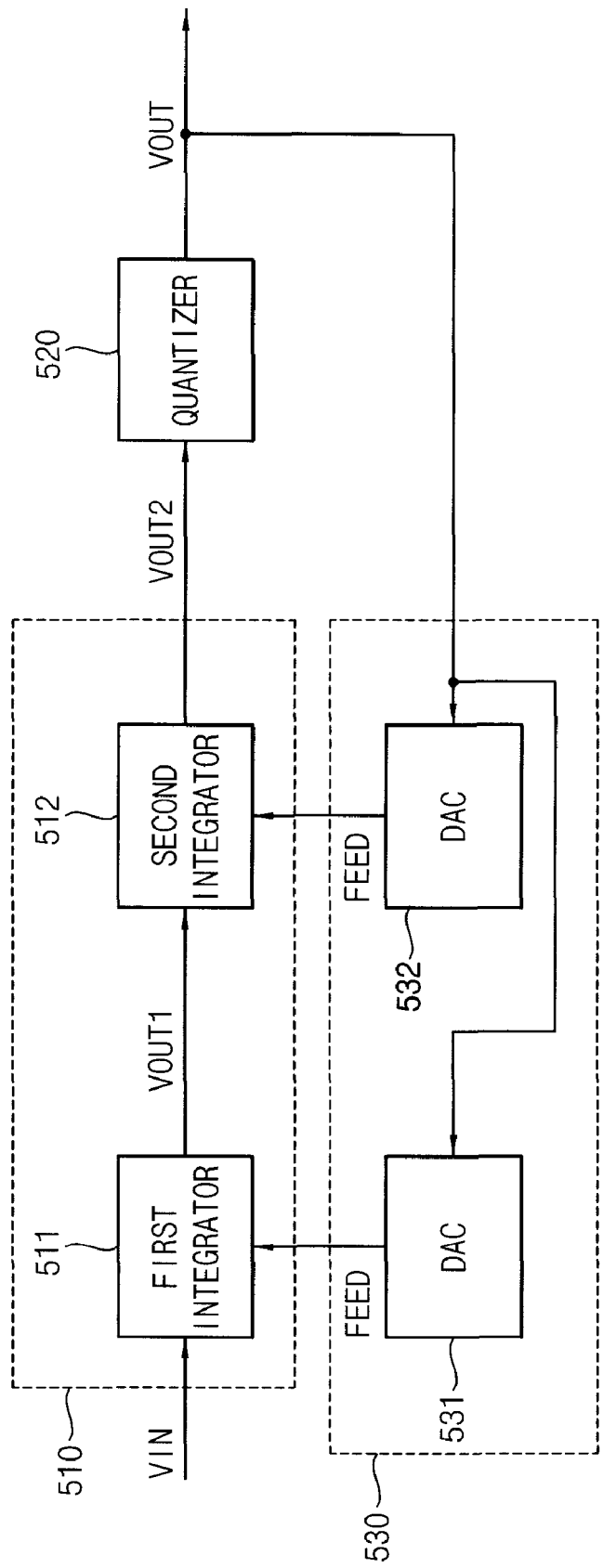
FIG. 5 is a block diagram illustrating a delta-sigma modulator according to some example embodiments.

FIG. 5 is a block diagram illustrating a delta-sigma modulator according to an embodiment of the inventive concept. Referring to FIG. 5, a delta-sigma modulator 500 comprises an active filter 510, a quantizer 520 and a digital-analog converting unit 530.

The active filter 510 includes a first filter 511 and a second filter 512. In one variation of the illustrated embodiment, the first filter 511 may be a first integrator 511, and the second filter 512 may be a second integrator 512. Each of the first integrator 511 and the second integrator 512 may include at least one passive component, such as a resistor, a capacitor, etc., and at least one active component, such as an operational amplifier. The first integrator 511 receives an input signal VIN and a feedback signal FEED, and generates a first integration signal VOUT1 based on the input signal VIN and the feedback signal FEED. The second integrator 512 receives the first integration signal VOUT1 and the feedback signal FEED, and generates a second integration signal VOUT2 based on the first integration signal VOUT1 and the feedback signal FEED.

The quantizer 520 receives an output signal of the active filter 510, or the second integration signal VOUT2. The quantizer 520 generates a digital output signal VOUT corresponding to the second integration signal VOUT2. The digital output signal VOUT may include a single bit or multiple bits. If the digital output signal VOUT is a multi-bit signal, whole values represented by multiple bits of the digital output signal VOUT may be used to indicate levels of the second integration signal VOUT2, or, alternatively, a portion of the values may be used. For example, if the digital output signal VOUT is a two-bit signal, the digital output signal VOUT may represent three levels or four distinct levels.

The digital-analog converting unit 530 generates the feedback signal FEED by converting the digital output signal VOUT. In certain embodiments, the digital-analog converting unit 530 may generate the feedback signal FEED in reverse proportion to the digital output signal VOUT. In other embodiments, the digital-analog converting unit 530 may generate the feedback signal FEED proportional to the digital output signal VOUT. The digital-analog converting unit 530 may include a first digital-analog converter 531 and a second digital-analog converter 532. The first digital-analog converter 531 may receive the digital output signal VOUT, and provide the first integrator 511 with the feedback signal FEED corresponding to the digital output signal VOUT. The second digital-analog converter 532 may receive the digital output signal VOUT, and provide the second integrator 512 with the feedback signal FEED corresponding to the digital output signal VOUT.

The active filter 510 included in the delta-sigma modulator 500 may operate as a low-pass filter for the input signal VIN, and operate as a high-pass filter for a noise or a quantization error. Accordingly, the delta-sigma modulator 500 may perform noise shaping to reduce noise.

The second integrator 512 adjusts a time period for receiving the first integration signal VOUT1 to compensate a variation of a time constant of the first integrator 511. Passive components of the first integrator 511, such as a resistor, a capacitor, etc., may be affected by manufacturing process variation(s), operating temperature variations, and/or the like. Thus, the time constant and filter coefficients of the first integrator 511 may be varied. The time period during which the second integrator 512 receives the first output signal VOUT1 may be adaptively adjusted to prevent a filter characteristic deterioration caused by the time constant variation of the first integrator 511. For example, when the time constant of the first integrator 511 increases compared with a desired time constant, the second integrator 512 increases the time period for receiving the first output signal VOUT1 to compensate the time constant variation.

As described above, the time constant variation of the first integrator 511 is compensated at the output stage of the first integrator 511. Accordingly, an AAF characteristic of the first integrator 511 may be maintained, and the delta-sigma modulator 500 may have a small circuit size without the need of an additionally provided anti-aliasing filter.

Figure 6:
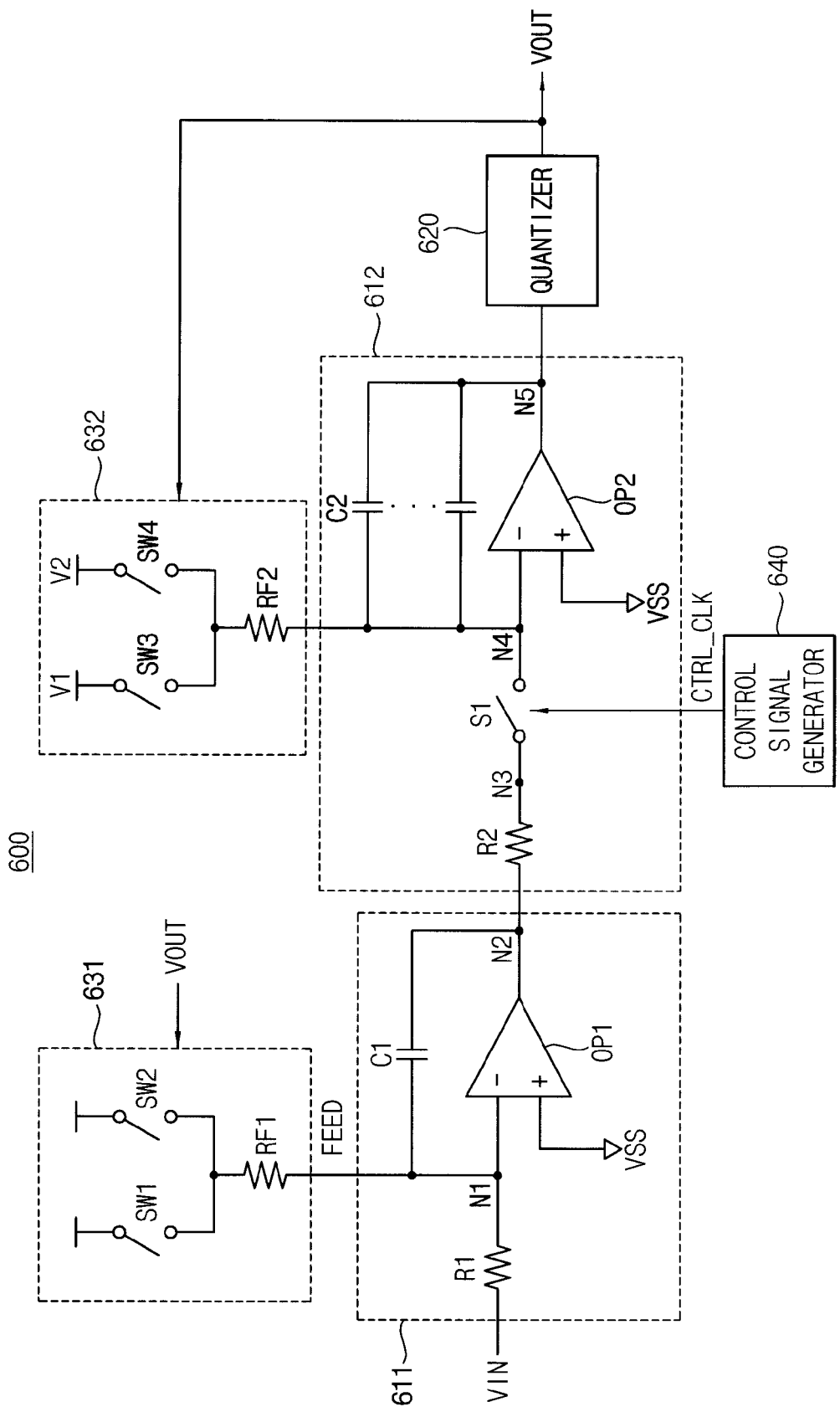
FIG. 6 is a circuit diagram illustrating an example of the delta-sigma modulator of FIG. 5.

FIG. 6 is a circuit diagram illustrating another example of a delta-sigma modulator according to an embodiment of the inventive concept. Referring to FIG. 6, a delta-sigma modulator 600 comprises a first integrator 611, a second integrator 612, a quantizer 620, a first digital-analog converter 631, a second digital-analog converter 632 and a control signal generating unit 640.

The first integrator 611 may include a first resistor R1, a first capacitor C1 and a first operational amplifier OP1. The first resistor R1 may include a first terminal for receiving an input signal VIN, and a second terminal coupled to a first node N1. The first capacitor C1 may include a first terminal coupled to the first node N1 and a second terminal coupled to a second node N2. The first operational amplifier OP1 may include a first input terminal coupled to the first node N1, a second input terminal coupled to a power supply voltage VSS (e.g., a ground voltage), and an output terminal coupled to the second node N2.

The first capacitor C1 may receive, at the first node N1, the input signal VIN through the first resistor R1 and a feedback signal FEED from the first digital-analog converter 631. In some embodiments, the feedback signal FEED may be in reverse proportion to a digital output signal VOUT. A signal applied to the first capacitor C1 may correspond to the sum of the input signal VIN and the feedback signal FEED. That is, a difference between the input signal VIN and an output signal of an active filter 611 and 612 (i.e., a second integration signal) may be applied to the first capacitor C1. In other embodiment, the feedback signal FEED may be in proportion to the digital output signal VOUT. The first integrator 611 may further include a subtractor for subtracting the feedback signal FEED from the input signal VIN. The first capacitor C1 may receive an output signal of the subtractor, which corresponds to the difference between the input signal VIN and the output signal of the active filter 611 and 612. The first integrator 611 may generate a first integration signal by integrating the difference between the input signal VIN and the output signal of the active filter 611 and 612.

The second integrator 612 includes a second resistor R2, a switch S1 and second capacitors C2 and a second operational amplifier OP2. The second resistor R2 may include a first terminal coupled to the second node N2 (i.e., an output terminal of the first integrator 611) and a second terminal coupled to a third node N3. The switch S1 may include a first terminal coupled to the third node N3 and a second terminal coupled to a fourth node N4. The switch S1 may be turned ON during a time period adjusted based on a time constant variation of the first integrator 611. The switch S1 may be turned ON in response to a control clock signal CTRL_CLK. The second capacitors C2 may include first terminals coupled to the fourth node N4 and second terminals coupled to a fifth node N5. The second capacitors C2 may receive, at the fourth node N4, the first integration signal through the second resistor R2 and the switch S1, and the feedback signal FEED from the second digital-analog converter 632. The sum of the first integration signal and the feedback signal FEED, which is applied to the second capacitors C2, may correspond to a difference between the first integration signal and the output signal of the active filter 611 and 612. The second operational amplifier OP2 may include a first input terminal coupled to the fourth node N4, a second input terminal coupled the power supply voltage VSS, and an output terminal coupled to the fifth node N5. The second integrator 612 may generate the second integration signal by integrating the difference between the first integration signal and the output signal of the active filter 611 and 612.

The quantizer 620 may receive the second integration signal that is the output signal of the active filter 611 and 612. The quantizer 620 may generate the digital output signal VOUT by quantizing the second integration signal.

As shown in FIG. 6, first digital-analog converter 631 includes resistor RF1 and switches SW1 and SW2, and second digital-analog converter 632 includes resistor RF2 and switches SW3 and SW2, connected to voltages V1 and V2, respectively. Each of the first digital-analog converter 631 and the second digital-analog converter 632 may generate the feedback signal by converting the digital output signal VOUT into an analog signal. The feedback signal FEED may be in reverse proportion to the digital output signal VOUT or in proportion to the digital output signal VOUT. The first digital-analog converter 631 may receive the digital output signal VOUT, and provide the first integrator 611 with the feedback signal FEED corresponding to the digital output signal VOUT. The second digital-analog converter 632 may receive the digital output signal VOUT, and provide the second integrator 612 with the feedback signal FEED corresponding to the digital output signal VOUT. While the first digital-analog converter 631 and the second digital-analog converter 632 are illustrated in FIG. 6 as receiving the digital output signal VOUT as an input signal, the first digital-analog converter 631 and/or the second digital-analog converter 632 may receive the input signal VIN, the first integration signal, or the second integration signal.

Impedances of passive components (i.e., the first resistor R1 and the first capacitor C1) of the first integrator 611 may be changed due to manufacturing process variation(s), operating temperature variation, or the like. Accordingly, a time constant and filter coefficients of the first integrator 611 may be different from a desired time constant and desired filter coefficients. For example, if a resistance of the first resistor R1 or a capacitance of the first capacitor C1 increases, the time constant of the first integrator 611 decreases, and thus the first integration signal too rapidly changes. If the resistance of the first resistor R1 or the capacitance of the first capacitor C1 decreases, the time constant of the first integrator 611 increases, and thus the first integration signal too slowly changes. Accordingly, the first integration signal may be distorted and may have a value different from a desired value.

The second integrator 612 adjusts the time period for receiving the first integration signal by using the switch S1 to compensate the time constant variation of the first integrator 611. For example, when the time constant of the first integrator 611 decreases, the second integrator 612 may decrease a turn-ON time of the switch S1. When the time constant of the first integrator 611 increases, the second integrator 612 may increase the turn-ON time of the switch S1. Since the turn-ON time of the switch S1 is adjusted to compensate the time constant variation of the first integrator 611, a signal at the second terminal of the switch S1 may have a desired value despite of the time constant variation. The switch S1 may be turned ON in response to the control clock signal CTRL_CLK generated by the control signal generating unit 640.

As described above, the time constant variation of the first integrator 611 is compensated at the output stage of the first integrator 611. Accordingly, noise caused by modulation between an input signal and a switch control signal does not occur, and an AAF characteristic of the first integrator 611 may be maintained.

While the delta-sigma modulator 600 including two integrators 611 and 612 is illustrated in FIG. 6, the delta-sigma modulator 600 might alternately be configured with three or more integrators. While the delta-sigma modulator 600 is illustrated in FIG. 6 as having a single loop configuration where the integrators 611 and 612 are serially connected, the delta-sigma modulator 600 might alternately be configured in a multiple loop configuration.

FIG. 7 is a circuit diagram further illustrating the control signal generating unit associated with the delta-sigma modulator of FIG. 6. Referring to FIG. 7, a control signal generating unit 700 comprises a reference generating unit 710, a current generating unit 720, a voltage generating unit 730 and a comparing unit 740.

The reference generating unit 710 generates a first reference voltage VREF1 and a second reference voltage VREF2. In certain embodiments, the reference generating unit 710 may include a voltage divider coupled between a first power supply voltage VDD and a second power supply voltage VSS. For example, the reference generating unit 710 may include serially-coupled resistors 711, 712 and 713. The reference generating unit 710 may generate the first reference voltage VREF1 at a node N6 and the second reference voltage VREF2 at a node N8.

The current generating unit 720 may generate a current corresponding to a time constant variation of the first integrator 611 illustrated in FIG. 6 based on the first reference voltage VREF1. The current generating unit 720 may include a resistor 721, an operational amplifier 722 and an NMOS transistor 723. The resistor 721 may be coupled between a node N7 and the second power supply voltage VSS. The operational amplifier 722 may include a first input terminal coupled to the node N6, a second input terminal coupled to the node N7, and an output terminal coupled to a gate terminal of the NMOS transistor 723. Since the operational amplifier 722 has a high DC gain, a voltage at the node N7 may have a level substantially the same as a level of the first reference voltage VREF1. Accordingly, unless a resistance of the resistor 721 is changed, the current generating unit 720 may generate a substantially constant current.

The voltage generating unit 730 may generate a voltage VX corresponding to the time constant variation of the first integrator 611 illustrated in FIG. 6 based on the current generated by the current generating unit 720. The voltage generating unit 730 may include a capacitor 731, a reset switch 733 and a feedback switch 732. The capacitor 731 may be coupled between the first power supply voltage VDD and a node N9. The reset switch 733 may be coupled in parallel with the capacitor 731. The feedback switch 732 may be coupled between the node N9 and the current generating unit 720. The capacitor 731 may be charged based on the current generated by the current generating unit 720 to generate the voltage VX. The reset switch 733 may be turned ON in response to a reset signal RST activated at a frequency that is the same as an operation frequency of the delta-sigma modulator 600 of FIG.

6. The feedback switch 732 may receive a control clock signal CTRL_CLK as a switch control signal. In certain embodiments, the feedback switch 732 may be turned ON when the control clock signal CTRL_CLK has a logic low level. When the feedback switch 732 is turned ON, the current generated by the current generating unit 720 is provided to the capacitor 731.

The comparing unit 740 may generate the control clock signal by comparing the voltage VX generated by the voltage generating unit 730 with the second reference voltage VREF2.

In an assumed initial state, the reset switch 733 is turned ON, and the capacitor 731 is discharged. The voltage VX generated by the voltage generating unit 730 may have a level substantially the same as a level of the first power supply voltage VDD, and the comparing unit 740 may generate the control clock signal CTRL_CLK having a logic low level. The feedback switch 732 may be turned ON.

When the reset switch 733 is turned OFF, the capacitor 731 may be charged based on the current generated by the current generating unit 720. As the capacitor 731 is charged, a voltage between two terminals of the capacitor 731 increases, and the voltage VX generated by the voltage generating unit 730 decreases.

When the voltage VX becomes higher than the second reference voltage VREF2, the comparing unit 740 may generate the control clock signal CTRL_CLK having a logic high level. The feedback switch 732 may receive the control clock signal CTRL_CLK, and be turned OFF.

The reset switch 733 may be turned ON again in response to the reset signal RST, and the capacitor 731 may be discharged. The reset signal RST may be periodically activated at a frequency that is the same as the operation frequency of the delta-sigma modulator 600 of FIG. 6. The control signal generating unit 700 may repeatedly perform operations described above in response to the periodically activated reset signal RST.

If a resistance of the resistor 721 increases due to a manufacturing process variation, operating temperature variation, or the like, the current generated by the current generating unit 720 decreases. By decreasing the current, the capacitor 731 may be slowly charged, and the voltage VX may slowly decrease. Accordingly, the control clock signal CTRL_CLK may have a lengthened low level period and a shortened high level period. That is, a duty cycle ratio of the control clock signal CTRL_CLK may be decreased. If the resistance of the resistor 721 decreases due to a manufacturing process variation, operating temperature variation, or the like, the current generated by the current generating unit 720 increases. By increasing the current, the capacitor 731 may be rapidly charged, and the voltage VX may rapidly decrease. Accordingly, the control clock signal CTRL_CLK may have a shortened low level period and a lengthened high level period. That is, a duty cycle ratio of the control clock signal CTRL_CLK may be increased.

If the capacitance of the capacitor 731 increases due to a manufacturing process variation, operating temperature variation, or the like, the voltage VX may slowly decrease. Accordingly, the control clock signal CTRL_CLK may have a lengthened low level period and a shortened high level period. That is, the duty cycle ratio of the control clock signal CTRL_CLK may be decreased. If the capacitance of the capacitor 731 decreases due to a manufacturing process variation, operating temperature variation, or the like, the voltage VX may rapidly decrease. Accordingly, the control clock signal CTRL_CLK may have a shortened low level period and a lengthened high level period. That is, the duty cycle ratio of the control clock signal CTRL_CLK may be increased.

As described above, the duty cycle ratio of the control clock signal CTRL_CLK is adjusted depending on impedance variations for the resistor 721 and the capacitor 731. In certain embodiments, the resistor 721 and the capacitor 731 may have a resistance and a capacitance that correspond to some multiplicative value of the resistance of a first resistor R1 and a capacitance of a first capacitor C1 included in a first integrator 611, as illustrated in FIG. 6. When the resistance of the first resistor R1 and/or the capacitance of the first capacitor C1 vary due to some process/temperature variation, or the like, the resistance of the resistor 721 and/or the capacitance of the capacitor 731 will also vary. Thus, the control signal generating unit 700 may generate the control clock signal CTRL_CLK having a duty cycle ratio that is adjusted to compensate for a time constant variation in the first integrator 611 of FIG. 6, for example.

Figure 8:
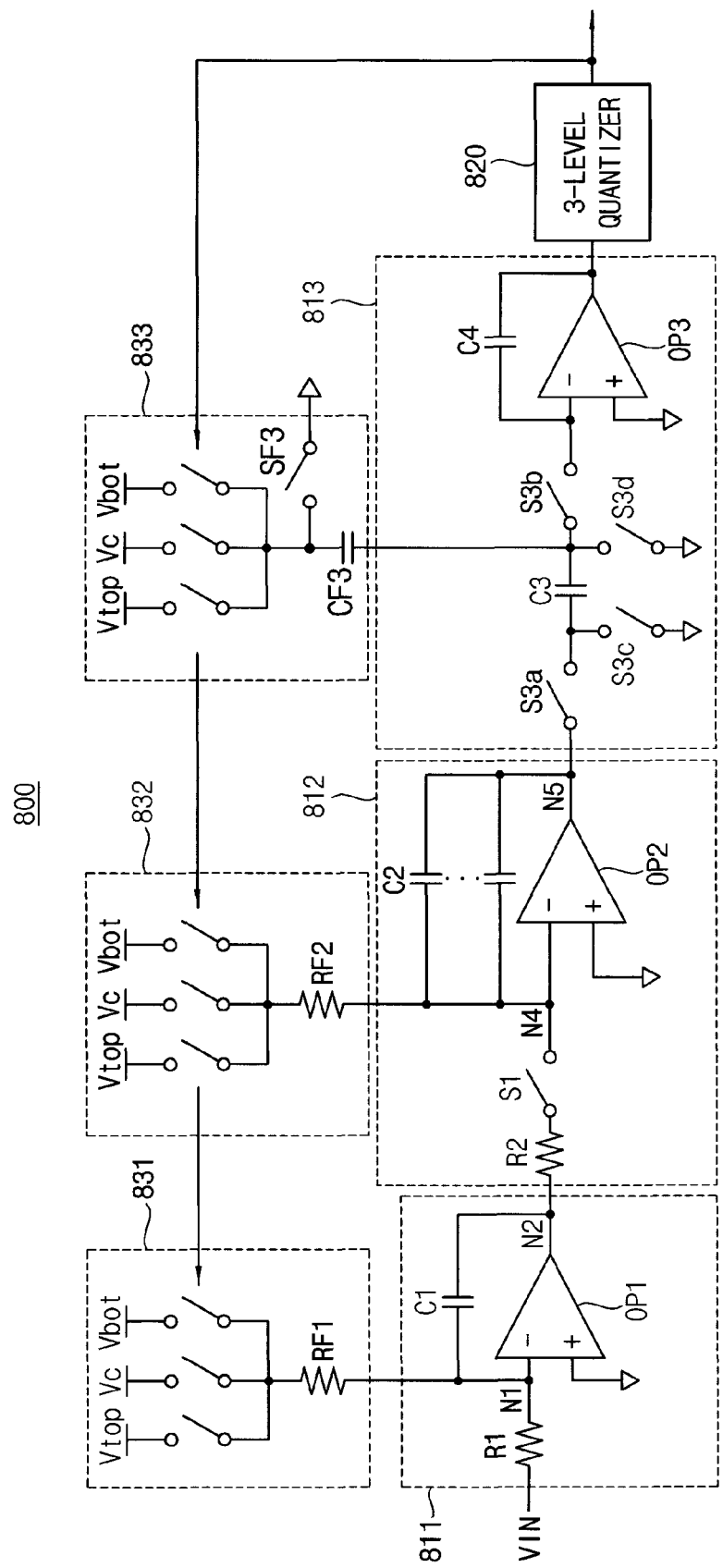
FIG. 8 is a circuit diagram illustrating another example of the delta-sigma modulator of FIG. 5.

FIG. 8 is a circuit diagram illustrating another example of a delta-sigma modulator according to an embodiment of the inventive concept. Referring to FIG. 8, a delta-sigma modulator 800 comprises a first integrator 811, a second integrator 812, a third integrator 813, a quantizer 820, a first digital-analog converter 831, a second digital-analog converter 832 and a third digital-analog converter 833.

Thus, the delta-sigma modulator 800 comprises a third order active filter 811, 812 and 813. The first integrator 811 has a similar configuration to the first integrator 611 illustrated in FIG. 6. The second integrator 812 has a similar configuration to the second integrator 612 illustrated in FIG. 6. The second integrator 812 may include parallel connected capacitors C2. The capacitance of the parallel connected capacitors C2 may be adjusted by connecting or disconnecting at least one of capacitors C2. The second integrator 812 may require a low capacitance compared with the first integrator 811, and thus the second integrator 812 may be not largely increased in size by the parallel connected capacitors C2. The third integrator 813 may be a discrete-time loop filter including a third operational amplifier OP3 and a switched capacitor C3, S3a, S3b, S3c and S3d. Thus, the third integrator 813 may be relatively insensitive to a process variations since coefficients of the switched capacitor C3, S3a, S3b, S3c and S3d are determined by capacitors C3 and C4. Even though the third integrator 813 is a discrete-time loop filter as illustrated in FIG. 8, the third integrator 813 may not require an additional anti-aliasing filter since the first integrator 811 maintains an AAF characteristic.

The quantizer 820 may generate a three level digital output signal. The first digital-analog converter 831, the second digital-analog converter 832 and the third digital-analog converter 833 may generate a feedback signal by converting the digital output signal. Each of the first digital-analog converter 831, the second digital-analog converter 832 and the third digital-analog converter 833 may include three switches coupled to a high power supply voltage Vtop, a power supply voltage Vc and a low power supply voltage Vbot, respectively, and a resistor RF1 or RF2 or a switched capacitor CF3 and SF3. In certain embodiments, the first digital-analog converter 831, the second digital-analog converter 832 and the third digital-analog converter 833 may generate the feedback signal in reverse proportion to the digital output signal. For example, when the digital output signal indicates a high level, the first digital-analog converter 831, the second digital-analog converter 832 and the third digital-analog converter 833 may turn ON a switch coupled to the low power supply voltage Vbot.

The second integrator 812 adjusts a time period for receiving a first integration signal generated by the first integrator 811 to compensate a variation of a time constant of the first integrator 811. That is, an effective integration time of the first integrator 811 is controlled by the second integrator 812. Accordingly, in the delta-sigma modulator 800 of FIG. 8 using a post integration time control technique, noise caused by modulation between an input signal and a switch control signal does not occur and an AAF characteristic may be maintained.

Figure 9:
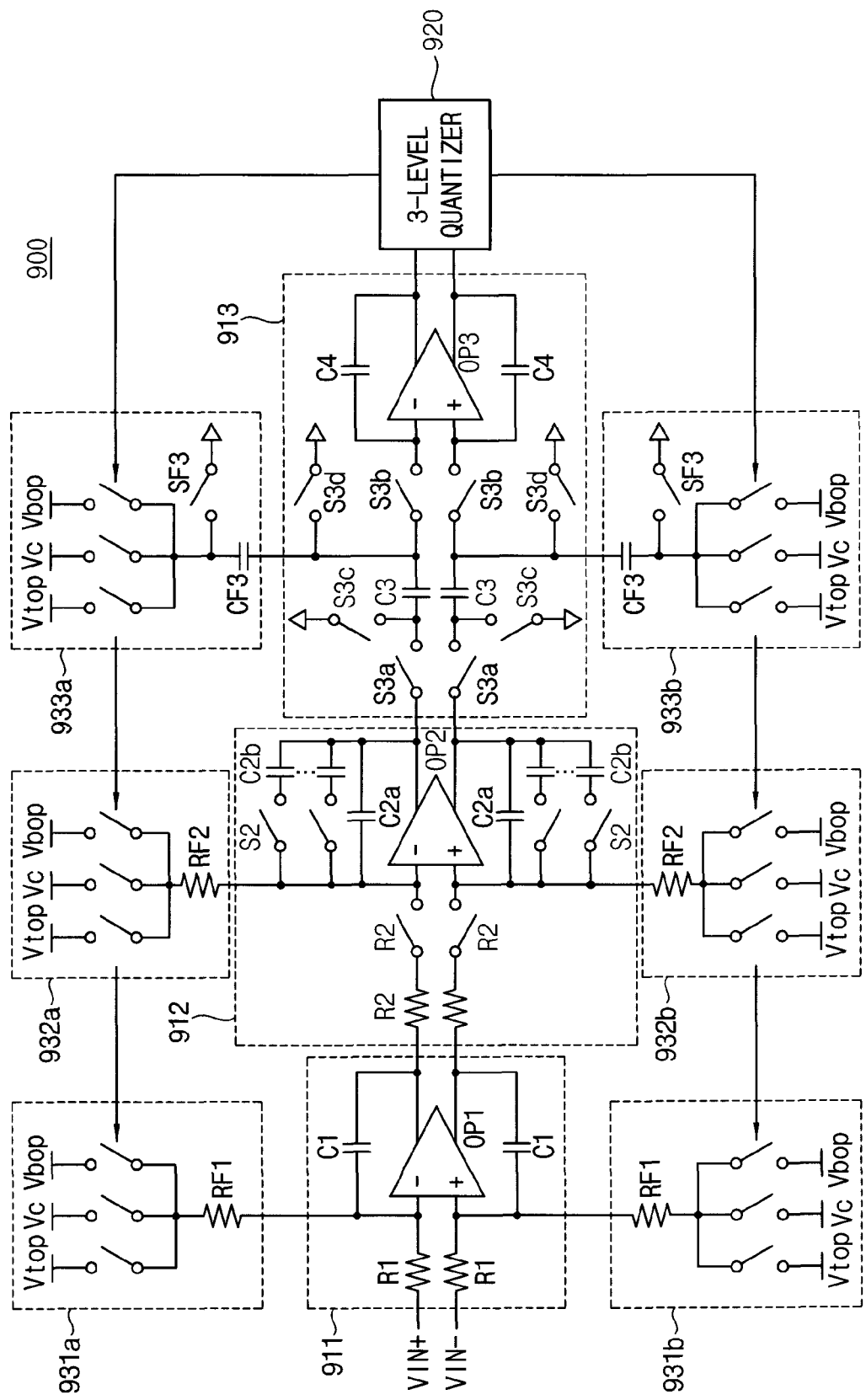
FIG. 9 is a circuit diagram illustrating still another example of the delta-sigma modulator of FIG. 5.

FIG. 9 is a circuit diagram illustrating still another delta-sigma modulator according to an embodiment of the inventive concept. Referring to FIG. 9, a delta-sigma modulator 900 comprises a first integrator 911, a second integrator 912, a third integrator 913, a quantizer 920, first and second digital-analog converters 931a and 931b coupled to the first integrator 911, third and fourth digital-analog converters 932a and 932b coupled to the second integrator 912, and fifth and sixth digital-analog converters 933a and 933b coupled to the third integrator 913.

The delta-sigma modulator 900 of FIG. 9 has a similar configuration to the delta-sigma modulator 800 of FIG. 8, but alternatively from the delta-sigma modulator 800 of FIG. 8, it is implemented using differential circuits receiving differential input signals VIN+ and VIN−.

Figure 10:
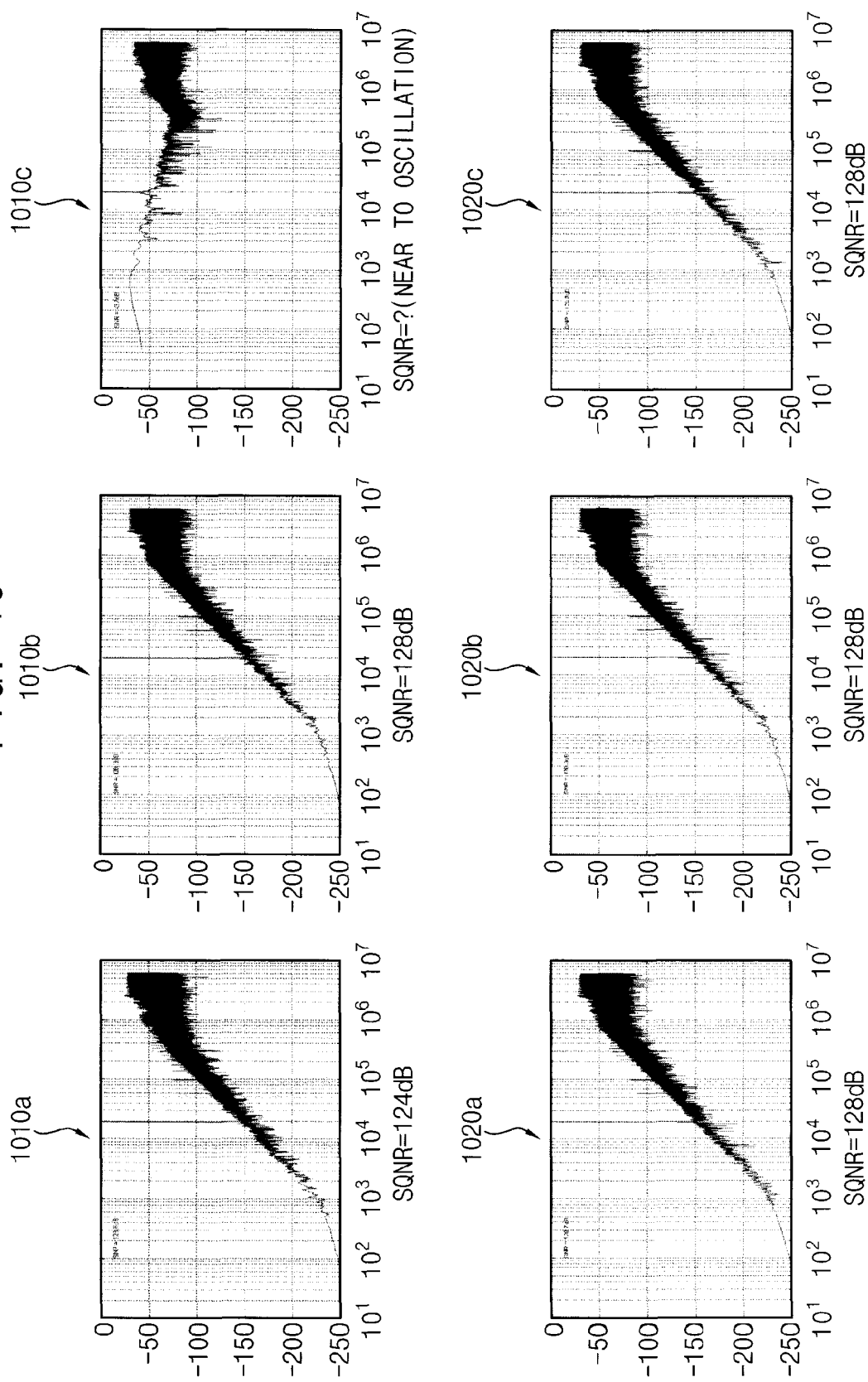
FIG. 10 is graphs illustrating simulation results of signal-to-quantization noise ratio (SQNR) in delta-sigma modulators using post integration time control according to some example embodiments.

FIG. 10 is graphs illustrating simulation results of signal-to-quantization noise ratio (SQNR) in delta-sigma modulators using post integration time control according to some example embodiments.

In FIG. 10, 1010a, 1010b and 1010c are simulation results when the post integration time control is not applied, and 1020a, 1020b and 1020c are simulation results when the post integration time control is applied. In FIG. 10, 1010a and 1020a indicate simulation results when impedances for passive components increase, 1010b and 1020b indicate simulation results when impedances for passive components are stable, and 1010c and 1020c indicate simulation results when impedances for passive components decrease.

Referring to FIG. 10, the SQNR is about 124 dB in the simulation result 1010a, where the post integration time control is not applied, and a resistance of a resistor and a capacitance of a capacitor included in a conventional delta-sigma modulator are increased by about 20%, respectively. The SQNR may be not measured due to oscillation of result signals in the simulation result 1010c, where the post integration time control is not applied, and the resistance and the capacitance are decreased by about 10%, respectively.

The SQNR is about 128 dB in the simulation result 1020a, where the post integration time control is applied, and a resistance of a resistor and a capacitance of a capacitor included in a delta-sigma modulator according to some example embodiments are increased by about 20%, respectively. The SQNR is about 128 dB in the simulation result 1020c, where the post integration time control is applied, and the resistance and the capacitance are decreased by about 20%, respectively.

When the post integration time control is applied, the SQNR when passive components included in the delta-sigma modulator using the post integration time control are changed, is substantially the same as the SQNR when the SQNR is not changed.

Figure 11:
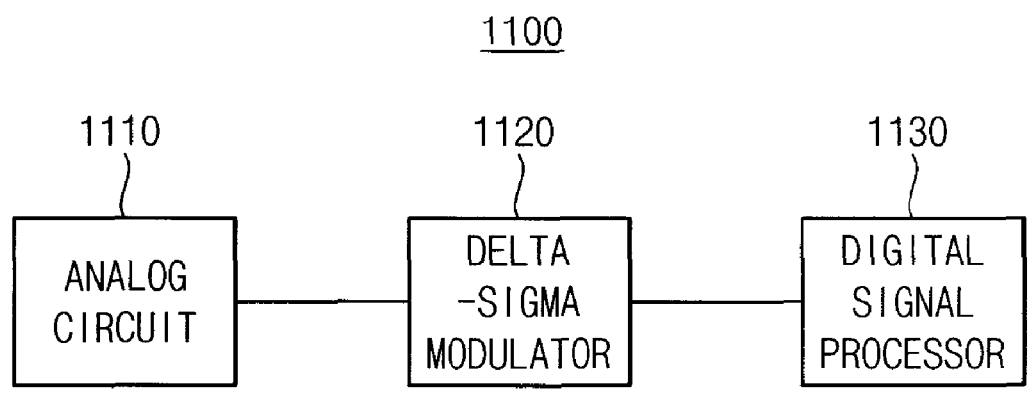
FIG. 11 is a block diagram illustrating a system including a delta-sigma modulator according to some example embodiments.

FIG. 11 is a block diagram illustrating a system including a delta-sigma modulator according to an embodiment of the inventive concept. Referring to FIG. 11, a system 1100 comprises an analog circuit 1110, a delta-sigma modulator 1120 and a digital signal processor 1130.

In certain embodiments, the delta-sigma modulator 1120 may be a delta-sigma analog-digital converter that receives an analog signal from the analog circuit 1110 and performs oversampling and noise shaping to provide a digital signal to the digital signal processor 1130. For example, the system 1100 may be a wireless signal receiver, where the analog circuit 1110 filters a received wireless signal, the delta-sigma modulator 1120 converts the filtered wireless signal into a digital signal, and the digital signal processor 1130 process the digital signal received from the delta-sigma modulator 1120.

In other embodiments, the delta-sigma modulator 1120 may be a delta-sigma digital-analog converter that receives a digital signal from the digital signal processor 1130 and performs oversampling and noise shaping to provide an analog signal to the analog circuit 1110. For example, the system 1100 may be an audio system, where the delta-sigma modulator 1120 converts a digital audio signal received from the digital signal processor 1130 into an analog signal, and the analog circuit 1110 outputs sound.

As described above, the active filter and the delta-sigma modulator according to the illustrated embodiments of the inventive concept compensate for passive component variations and/or time constant variations using post integration time control, thereby reducing switching noise and improving a signal-to-quantization noise ratio. Further, the active filter and the delta-sigma modulator according to embodiments of the inventive concept may not require an additional anti-aliasing filter and therefore have a relatively small size.

The active filter and the delta-sigma modulator according to embodiments of the inventive concept may be applied to any device or system where a high-precision and high-resolution signal conversion is required. The active filter and the delta-sigma modulator according to some example embodiments may be efficiently applied to a wireless communication device, an audio device, a measurement device, a broadcasting device, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An active filter, comprising:
   a first filter configured to receive an input signal, and generate a first output signal by filtering the input signal;
   a control signal generating unit configured to generate a control clock signal having a duty cycle ratio adjusted in accordance with a variation of a time constant of the first filter; and
   a second filter configured to generate a second output signal by filtering the first output signal while the control clock signal has a logic high level.

2. The active filter of claim 1, wherein the control signal generating unit is configured to increases the duty cycle ratio of the control clock signal as the time constant of the first filter increases, and decrease the duty cycle ratio of the control clock signal as the time constant of the first filter decreases.

3. The active filter of claim 1, wherein the control signal generating unit comprises:
   a reference generating unit configured to generate a first reference voltage and a second reference voltage;
   a current generating unit configured to generate a current corresponding to the variation of the time constant of the first filter based on the first reference voltage;
   a voltage generating unit configured to generate a voltage corresponding to the variation of the time constant of the first filter based on the current generated by the current generating unit; and
   a comparing unit configured to generate the control clock signal by comparing the voltage generated by the voltage generating unit with the second reference voltage.

4. The active filter of claim 3, wherein the current generating unit comprises:
   a resistor having a resistance that varies in proportion to an impedance variation of at least one passive component included in the first filter, such that the current generating unit generates the current based on the variable resistance of the resistor, and
   wherein the voltage generating unit comprises:
      a capacitor having a capacitance that varies in proportion to the impedance variation of the at least one passive component included in the first filter, such that the voltage generating unit generates the voltage based on the variable capacitance of the capacitor.

5. An active filter, comprising:
   a first filter configured to receive an input signal, and generate a first output signal by filtering the input signal; and
   a second filter configured to generate a second output signal by filtering the first output signal,
   wherein the first filter comprises:
      a first resistor having a first terminal receiving the input signal and a second terminal coupled to a first node;
      a first capacitor having a first terminal coupled to the first node and a second terminal coupled to a second node; and
      a first operational amplifier having an input terminal coupled to the first node and an output terminal coupled to the second node, and
   wherein the second filter comprises:
      a second resistor having a first terminal coupled to the second node and a second terminal coupled to a third node;
      a switch having a first terminal coupled to the third node and a second terminal coupled to a fourth node, the switch being turned ON during a time period adjusted on the basis of a variation in a time constant of the first filter;
      at least one second capacitor having a first terminal coupled to the fourth node and a second terminal coupled to a fifth node; and
      a second operational amplifier having an input terminal coupled to the fourth node and an output terminal coupled to the fifth node.

6. An active filter, comprising:
   a first filter configured to receive an input signal, and generate a first output signal by filtering the input signal; and
   a second filter configured to generate a second output signal by filtering the first output signal,
   wherein the first filter comprises:
      a first resistor having a first terminal receiving the input signal and a second terminal coupled to a first node;
      a first capacitor having a first terminal coupled to the first node and a second terminal coupled to a second node; and
      a first operational amplifier having an input terminal coupled to the first node and an output terminal coupled to the second node, and
   wherein the second filter comprises:
      a switch having a first terminal coupled to the second node and a second terminal coupled to a third node, the switch being turned ON during a time period adjusted on the basis of a variation in a time constant of the first filter;
      a second resistor having a first terminal coupled to the third node and a second terminal coupled to a fourth node;
      at least one second capacitor having a first terminal coupled to the fourth node and a second terminal coupled to a fifth node; and
      a second operational amplifier having an input terminal coupled to the fourth node and an output terminal coupled to the fifth node.

7. The active filter of claim 6, wherein the time period increases as the time constant of the first filter increases, and decreases as the time constant of the first filter decreases.

* * * * *